United States Patent
Ranganathan et al.

(10) Patent No.: US 11,418,208 B2
(45) Date of Patent: Aug. 16, 2022

(54) LIGHT-TO-DIGITAL CONVERTER ARRANGEMENT AND METHOD FOR LIGHT-TO-DIGITAL CONVERSION

(71) Applicant: ams AG, Premstätten (AT)

(72) Inventors: Rohit Ranganathan, Eindhoven (NL); Ravi Kumar Adusumalli, Eindhoven (NL); Dinesh Kuruganti, Eindhoven (NL)

(73) Assignee: AMS AG, Premstätten (AT)

( * ) Notice: Subject to any disclaimer, the term of this patent is extended or adjusted under 35 U.S.C. 154(b) by 56 days.

(21) Appl. No.: 17/048,280

(22) PCT Filed: Apr. 16, 2019

(86) PCT No.: PCT/EP2019/059809
§ 371 (c)(1),
(2) Date: Oct. 16, 2020

(87) PCT Pub. No.: WO2019/201923
PCT Pub. Date: Oct. 24, 2019

(65) Prior Publication Data
US 2021/0105020 A1    Apr. 8, 2021

(30) Foreign Application Priority Data
Apr. 19, 2018    (EP) .................................... 18168287

(51) Int. Cl.
*H03M 3/00*    (2006.01)
*H03M 1/14*    (2006.01)
(Continued)

(52) U.S. Cl.
CPC ............... *H03M 1/141* (2013.01); *G01J 1/46* (2013.01); *H03M 1/466* (2013.01)

(58) Field of Classification Search
CPC .......... H03M 1/123; H03M 1/56; H03M 1/34; H03M 1/08; H03M 1/1023; H03M 1/12;
(Continued)

(56) References Cited

U.S. PATENT DOCUMENTS 5,929,800 A * 7/1999 Zhou .................... H04N 5/3575
                                                        348/E3.018
6,366,231 B1 * 4/2002 Rao ......................... H03M 1/60
                                                        341/166
(Continued)

FOREIGN PATENT DOCUMENTS

EP    2863192 A1    4/2015

OTHER PUBLICATIONS

International Search Report and Written Opinion dated Oct. 24, 2019 in PCT Application No. PCT/EP2019/059809, 4 pages.
(Continued)

*Primary Examiner* — Linh V Nguyen
(74) *Attorney, Agent, or Firm* — MH2 Technology Law Group LLP

(57) ABSTRACT

A method for light-to-digital conversion includes setting a time integrator circuit into a reference condition and starting to integrate charge from a sensor device for the duration of an integration time. An integration signal is generated and is indicative of the integrated charge. The integration signal is compared with an adjustable reference signal. A first count is generated when the comparison indicates that the integration signal has reached an integration range, wherein the integration range is defined by a low and a high voltage. A second count is generated when the comparison indicates that the integration signal has reached the adjustable reference signal. The adjustable reference signal is incremented in discrete steps when a second count has been generated. Then, the time integrator circuit is reset into the reference
(Continued)

condition, when the comparison indicates that the integration signal has reached the integration range. The generated first counts is collected as first count signal and the generated second counts are collected as second count signal. Finally, a digital output signal is generated depending on the first count signal and the second count signal.

15 Claims, 3 Drawing Sheets

(51) Int. Cl.
  *G01J 1/46* (2006.01)
  *H03M 1/46* (2006.01)

(58) Field of Classification Search
  CPC .... H03M 1/0863; H03M 1/1245; H03M 1/46; H03M 3/462; H03M 1/0626; H03M 1/124; H03M 3/476; H03M 1/403; H03M 1/462; H03M 1/466; H03M 1/66; H03M 1/1205; H03M 1/745; H03M 3/43; H03M 1/004; H03M 3/422; H03M 3/458; H03M 1/0658; H03M 1/0678; H03M 1/144; H03M 3/32
  USPC .................................. 341/118–121, 143, 155
  See application file for complete search history.

(56) References Cited

U.S. PATENT DOCUMENTS

| | | | | |
|---|---|---|---|---|
| 7,164,379 | B1 * | 1/2007 | Rao | H03M 1/52 |
| | | | | 341/161 |
| 10,412,813 | B1 * | 9/2019 | Chen | H05B 47/105 |
| 2008/0012741 | A1 * | 1/2008 | Nakata | H03M 1/14 |
| | | | | 341/155 |
| 2011/0290987 | A1 * | 12/2011 | Liu | G01J 1/46 |
| | | | | 250/2 UAL |
| 2014/0014821 | A1 * | 1/2014 | Kawahito | H03M 3/46 |
| | | | | 341/110 |
| 2014/0293272 | A1 * | 10/2014 | Xu | G01J 1/4204 |
| | | | | 356/72 |
| 2015/0102209 | A1 * | 4/2015 | Xu | G01J 1/46 |
| | | | | 250/214 LA |
| 2019/0268557 | A1 * | 8/2019 | Kawahito | H03M 1/141 |

OTHER PUBLICATIONS

Zhe, G. et al. "Indirect-Feedback Sigma-Delta Image Sensors: Theory, Modeling and Design", IEEE Transactions on Circuits and Systems 1: Regular Papers, IEEE, US, vol. 61, No. 1, Jan. 1, 2014, pp. 48-60.

International Search Report and Written Opinion dated July 4, 2019 in PCT Application No. PCT/EP2019/059809, 4 pages.

* cited by examiner

LIGHT-TO-DIGITAL CONVERTER ARRANGEMENT AND METHOD FOR LIGHT-TO-DIGITAL CONVERSION

CROSS-REFERENCE TO RELATED APPLICATIONS

The present application is the national stage entry of International Patent Application No. PCT/EP2019/059809, filed on Apr. 16, 2019, which claims the benefit of priority of European Patent Application No. 18168287.3, filed on Apr. 16, 2018, all of which are hereby incorporated by reference in their entirety for all purposes.

FIELD OF INVENTION

This invention relates to the field of light-to-digital converter arrangements and methods for light-to-digital conversion.

BACKGROUND OF THE INVENTION

Color and ambient light sensors find increasing application in mobile devices such as Smartphones, tablets or in various electronic equipment related to television or room lighting. Under normal light conditions the optical sensors and their dedicated signal processing circuits have reached a state of development that allows for an accurate measurement of lighting conditions or even colors of lighting under changing lighting. However, in low light conditions light-to-digital conversion embedded in optical sensor arrangement often fails to provide an accurate estimate of the incident light. Typically, only few counts are detected and losing even a few counts can manifest in a larger error than under bright light conditions.

Signal processing circuits often employ first order continuous time integrator circuitry. These circuits rely on a defined integration range and reference capacitors that are used to initialize or reset the integrator for integration of sensor signals. One way to prepare such signal processing circuits for low light conditions is to make the integration range and reference capacitors smaller in order to achieve higher gains. This means that higher gains have more impact on noise and accuracy.

It is to be understood that any feature described hereinafter in relation to any one embodiment may be used alone, or in combination with other features described hereinafter, and may also be used in combination with one or more features of any other of the embodiments, or any combination of any other of the embodiments, unless explicitly described as an alternative. Furthermore, equivalents and modifications not described below may also be employed without departing from the scope of the light-to-digital converter arrangement and the method for light-to-digital conversion as defined in the accompanying claims.

The following relates to an improved concept in the field of light-to-digital conversion. The improved concept provides means for implementing a light-to-digital converter arrangement and a method for light-to-digital conversion.

SUMMARY OF THE INVENTION

A light-to-digital converter arrangement may comprise a measurement frontend based on a time integrator, e.g. implemented as a first order modulator or a continuous time integrator, which integrates between two known voltage thresholds. There may be a lower threshold and an upper threshold. Each time the time integrator integrates until the upper threshold, a comparator triggers. The comparator trigger may subtract a pre-defined reference voltage that brings the output of the time integrator to the lower threshold. Then the integrator starts integration over again. The integration range defined by the lower threshold and the upper threshold, e.g. a low and a high voltage, is kept fixed for a gain setting of the light-to-digital converter arrangement and defines a maximum value of the reference voltage. However, the reference voltage is incremented in discrete steps and the comparator triggers at intermediate values which are smaller than the integration range. At these intermediate steps the pre-defined voltage is not subtracted from the output. For example, the integration range is sub-divided into $2^n$ levels or "bins" using a digital-to-analog converter with n being an integer number.

Typically, several integration cycles are conducted. The trigger events of the comparator, i.e. when reaching the pre-defined maximum value and the intermediate values of the reference voltage, are counted and collected as count signals, respectively. These count signals define an output signal of the light-to-digital converter arrangement. Typically, however, an integration cycle may start from an uncertain starting voltage. In order to account for this error an adaptive binning is applied to determine an initial value of the starting voltage. Furthermore, adaptive binning can also be used to adjust the intermediate values of the reference voltage and, thus, a step-size or "binning" of the discrete steps by which the reference signal is incremented.

In at least one embodiment a method for light-to-digital conversion is applied to a time integrator circuit. The time integrator circuit is connected to a sensor device. For example, the sensor device provides a sensor signal such as a current. Possible sensor devices include light sensors such as photodiodes or other current based sensors such as a resistive gas sensors.

In at least one embodiment the method for light-to-digital conversion comprises setting the time integrator circuit into a reference condition. Then, integration of charge from a sensor device connected to the time integrator circuit is started for the duration of an integration time. An integration signal is generated and is indicative of the integrated charge. The integration signal is then compared with an adjustable reference signal.

Two different counts are generated based on the comparison of the integration signal with the adjustable reference signal. A first count is generated when the comparison indicates that the integration signal has reached an integration range, i.e. a value that is defined by the integration range. The integration range is defined by a low and high voltage. For example, the integration range is given by the difference of the low and high voltage. A second count is generated when the comparison indicates that the integration signal has reached the adjustable reference signal, i.e. a value that is defined by the current value of the adjustable reference signal.

Furthermore, the adjustable reference signal is incremented in discrete steps when the second count has been generated.

The time integrator circuit is reset into the reference condition when the comparison indicates that the integration signal has reached the integration range.

The generated first counts and the generated second counts are collected as a first count signal and as a second count signal, respectively. Finally, a digital output signal is generated depending on the first count signal and the second count signal.

The reference condition can be set to a pre-defined value, e.g. a pre-defined reference voltage. The reference condition may be defined by or be equal to the integration range. However, the integration range may be subject to variations due to process and temperature changes. Thus, may introduce a systematic error in the measurement. Such error can be accounted for by setting the reference condition to a value different from the integration range. It is possible to set the reference condition to a value smaller or greater than the integration range. However, there may be procedural advantages to set the reference condition to a value greater than the integration range. This way, the time integrator circuit may be reset to a starting voltage which is lower than the low voltage which defines the integration range.

In at least one embodiment the adjustable reference signal is incremented in discrete steps of the integration range.

In at least one embodiment the discrete steps of the integration range are defined by a difference value of the low and high voltages divided by $2^n$, wherein n denotes an integer number.

In at least one embodiment the time integrator circuit is only set or reset back into the reference condition when a first count has been generated.

In at least one embodiment the integration range is kept constant during the integration time.

In at least one embodiment the integration time is subdivided into partial integration times using a clock signal. An initial partial integration time is defined as a time stamp at which the first of second counts is generated of the starting to integrate charge from a sensor device or resetting the time integrator circuit into the reference condition. An intermediate partial integration time is defined as a time stamp at which the further of second counts is generated after the initial partial integration time and before resetting the time integrator circuit into the reference condition.

The initial partial integration time may be different from the intermediate partial integration times. This may be due to the variations due to process and temperature changes discussed above. Furthermore, the initial partial integration time depends on the value of the reference condition.

In at least one embodiment the digital output signal is determined by the following equation:

$$ADC-OUT = (2^n - 1) \cdot CT_{LOUT} + CT_{COUT} + \frac{\sum Te(CT_{LOUT})}{Tc},$$

wherein ADC–OUT, $CT_{LOUT}$, $CT_{COUT}$, Te, and Tc denote the digital output signal, the first count signal, the second count signal, the initial partial integration time and the intermediate partial integration time, respectively. The integer number n denotes a number of integration cycles. In each integration cycle the time integrator circuit is set or reset into the reference condition. A given integration cycle terminates when a first count has been generated or when the overall integration time has been reached. The last term in the equation above, i.e. $\Sigma Te(CT_{LOUT})$ is taken over all integration cycles. In each integration cycle there may be a characteristic initial partial integration time. The sum is normalized with the intermediate partial integration time.

In at least one embodiment at starting the integration of charge from the sensor device and resetting the time integrator circuit into the reference condition, an initial value of the integration signal is determined. In addition, a step size of the adjustable reference signal can be adjusted using an adaptive binning algorithm and depending on the determined initial value of the integration signal.

In at least one embodiment a light-to-digital converter arrangement comprises a time integrator circuit comprising a sensor input for connecting a sensor device, a reference input for connecting an adjustable reference signal, and a result output for providing an integration signal. The time integrator circuit is arranged for integrating charge from the sensor device for the duration of an integration time.

A reset circuit is connected to the sensor input and arranged to start and/or reset the time integrator circuit into a reference condition.

And logic-and-calculation arrangement is connected to the result output and to the reset circuit. The logic-and-calculation arrangement is arranged for several functions including comparing the integration signal with an adjustable reference signal, generating a first count when the comparison indicates that the integration signal has reached an integration range. Integration range is defined by a low and high voltage. Furthermore, the functionality includes generating a second count when the comparison indicates that the integration signal has reached the adjustable reference signal. Finally, a digital output signal is generated depending on first and second counts collected as first count signal and second count signal, respectively.

An adjustable reference circuit is connected to the logic-and-calculation arrangement and arranged to increment the adjustable reference signal in discrete steps when the second count has been generated.

In at least one embodiment the logic-and-calculation arrangement comprises a control logic connected to the reset circuit. The control logic is arranged for resetting the time integrator circuit into the reference condition.

The reference condition can be set to a pre-defined value, e.g. a pre-defined reference voltage. The value of the reference condition may be adjustable and defined by the given application. For example, the value of the reference condition may be equal to the integration range or, in order to account for systematic errors, the reference condition can set to a value smaller or greater than the integration range.

In at least one embodiment the time integrator circuit comprises an integrator with an integration capacitor, an amplifier having a first amplifier input, a second amplifier input and an amplifier output. The amplifier is configured to integrate the charge from the sensor device on the first amplifier input. Furthermore, the amplifier receives a first reference voltage on the second amplifier input, and provide the integration signal on the amplifier output.

A comparator has a first comparator input, the reference input as a second comparator input and the comparator output. The comparator is configured to receive the integration signal on the first comparator input, receive the adjustable reference signal on the reference input, and provide a comparator output signal on the comparator output.

In at least one embodiment the logic-and-calculation arrangement comprises a latch which is connected to the comparator output of the comparator to form a latched comparator. The latch is arranged to provide the first and second counts depending on the comparator output signal and the clock signal.

In at least one embodiment the adjustable reference circuit comprises an n-bit digital-to-analog converter. The digital-to-analog converter is connected on its output side to the reference input and arranged to generate the adjustable reference signal. The term n denotes an integer number.

In at least one embodiment the digital-to-analog converter is arranged to increment the reference signal in discrete steps of the integration range. The discrete steps of the integration range are defined by the difference value of the low with high voltages divided by $2^n$, wherein n denotes an integer number.

In at least one embodiment the logic-and-calculation arrangement comprises a logic unit which is arranged to provide a control signal to the control unit in order to initiate resetting the time integrator circuit into the reference condition by means of the control unit. In addition or alternatively, the logic unit is arranged to determine an initial value of the integration signal at starting to integrate charge from the sensor device and resetting the time integrator circuit into the reference condition.

An optional calculation unit is arranged to adjust a step size of the adjustable reference signal using an adaptive binning algorithm and depending on the determined initial value or the integration signal.

Further implementations of the light-to-digital converter arrangement are readily derived from the various implementations and embodiments of the method for light-to-digital conversion and vice versa.

The improved concept discussed above proposes a light-to-digital converter arrangement and a method for light-to-digital conversion that can provide an increased gain paired with good linearity and low noise. The concept allows for higher gains without the need of scaling down parameters such as integration voltages or integration capacitors. For example, the integrating range can be fixed for every gain setting. For such conditions, the reference capacitor CREF and CF values are higher, therefore having lower system noise. The integration range can be sub-divided into $2^n$ levels using adjustable reference signal, e.g. provided by the digital-to-analog converter. This way an effective gain of the light-to-digital converter arrangement may be dependent on integration range and a number of reference levels $2^n$. Furthermore, an adaptive-binning algorithm allows for detecting a value of the integration signal after the initialisation sequence. Adaptive binning can also be used to adjust step sizes of the adjustable reference signal.

In the following, the concept presented above is described in further detail with respect to drawings, in which exemplary embodiments are presented.

In the exemplary embodiments and Figures below, similar or identical elements may each be provided with the same reference numerals. The elements illustrated in the drawings and their size relationships among one another, however, should not be regarded as true to scale. Rather individual elements, such as layers, components, and regions, may be exaggerated to enable better illustration or improved understanding.

DETAILED DESCRIPTION

Figure 1:
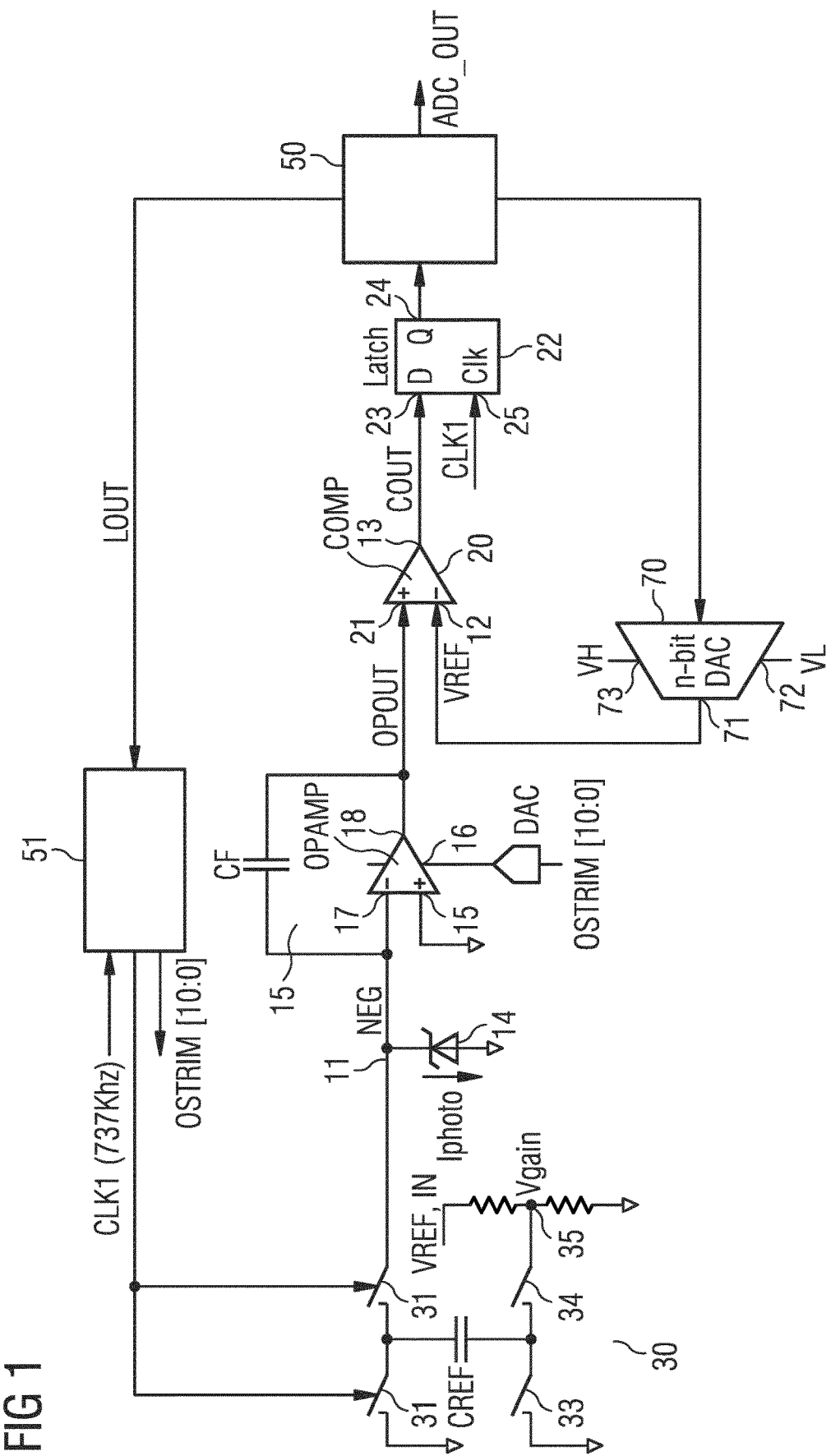
FIG. 1 shows an embodiment of a light-to-digital converter arrangement.

FIG. 1 shows an embodiment of a light-to-digital converter arrangement. The light-to-digital converter arrangement comprises a time integrator circuit 10, a reset circuit 30, a logic-and-calculation circuit 50 and an adjustable reference circuit 70. The light-to-digital converter may be designed as an integrated circuit.

The time integrator 10 may be implemented as a first order modulator or a continuous time integrator, for example. The time integrator circuit 10 comprising a sensor input 11, a reference input 12, and a result output 13. The sensor input 11 is connected to a sensor device 14. The sensor device 14 can be a photodiode, for example. However, the sensor device may be any sensor that provides a current as sensor signal, e.g. a resistive gas sensor or the like. Typically, the sensor device 14 is connected to the time integrator circuit 10 as an external component but may just as well be part of the same integrated circuit as the light-to-frequency converter in some embodiments.

The time integrator circuit 10 further comprises an integrator 15 with an integration capacitor CF, an amplifier 16 having a first amplifier input 17, a second amplifier input 18 and an amplifier output 19. Furthermore, a comparator 20 having a first comparator input 21, the reference input 12 as a second comparator input and the result output 13 as a comparator output. The result output 13 is connected to a latch 22 which together with the comparator 20 forms a latched comparator. The ledge comprises a latch input 23 which is connected to the result output 13. Furthermore, the ledge comprises a latch output 24 and clock input 25 for receiving a clock signal.

The logic-and-calculation arrangement 50 is connected to the time integrator circuit 10 via the latch 22 and result output 13. Furthermore, a feedback path connects the logic-and-calculation arrangement 50 with the reference input 12 of the comparator via the adjustable reference circuit 70. Another feedback path connects the logic-and-calculation arrangement 50 with a control unit 51. The logic-and-calculation arrangement may comprise further components such as a logic unit or a calculation unit. At least parts of the logic-and-calculation arrangement may be implemented as a microcontroller or an application-specific integrated circuit, ASIC.

The adjustable reference circuit 70 comprises an n-bit digital-to-analog converter 71 which on its input side is connected to the logic-and-calculation arrangement 50 and on its output side is connected to the reference input 12 of the comparator 20. The digital-to-analog converter 71 comprise supply terminals 72, 73 which are connected to a low voltage VL and a high-voltage VH, respectively.

The reset circuit 30 comprises a reference capacitor CREF which is connected in parallel to the sensor device 14. On one side the reference capacitor CREF is connected via a first switch 31 to a reference potential, e.g. ground potential, and via a second switch 32 to the sensor input 11. On another side the reference capacitor CREF is connected via a third switch 33 to the reference potential, e.g. ground potential, and via a fourth switch 34 to a reset reference VREF,IN. The fourth switch 34 is connected to a voltage divider 35, The voltage divider 35 is connected between the reset reference voltage VREFIN and ground potential. The switches 31 to 34 are connected to the control unit 51 by means of control lines.

Sensor signal acquisition can be initialized by applying an input control signal ADC_ON and an integration time signal STINT to a control input of the control unit 51 (not shown). Additionally, a clock signal CLK1 can be provided to the control unit 51. The first clock signal CLK1 can be provided by a clock generator (not shown) and/or be generated by the control unit 51. Typically, the light-to-digital converter arrangement is set into a reference condition and thereby cleared before signal acquisition proceeds. This can be achieved by means of the reset circuit 30, e.g. a control signal issued by the control unit 51 which causes switching of the switches 31 to 34. For example, switches 31 and 34 are closed and switches 32 and 33 open. Then the voltage divider 35 provides the reset reference voltage VREFIN to the reference capacitor CREF. The reference capacitor CREF generates a charge package QREF. The charge package QREF has a value according to $$Q_{ref} = V_{ref,in} \cdot C_{ref}$$

wherein $C_{ref}$ is a capacitance value of the reference capacitor CF and $V_{ref,in}$ is a voltage value of the reset reference voltage VREFIN. The control unit 51 then issues another control signal. For example, switches 31 and 34 are open and switches 32 and 33 closed. After closing the switches 32, 33, the charge package QREF is applied to an integration node NEG at the sensor input 11. Furthermore, first and second counters (discussed in further details below) are reset by applying a reset signal SRESET to the logic-and-calculation arrangement 50, respectively.

Depending on the input control signal ADC_ON, and after the light-to-digital converter arrangement has been set or cleared into the reference condition, signal acquisition is started and the sensor device 14 generates a sensor signal. In this embodiment the sensor device 14 is a photodiode and generates a photo-current Iphoto. The value of the photo-current depends on the intensity of the light incident on the photodiode. The photocurrent Iphoto flows through the photodiode, the sensor input 11 and the input 17 of the amplifier 17, and is integrated by integrator 15. The photodiode, the amplifier input 17 and the integration capacitor CF are each connected to the integration node NEG. Also the reference capacitor CREF is coupled to the integration node NEG via the second switch 32.

The integrator 15 generates an integration signal OPOUT at the amplifier output 19. The photocurrent Iphoto is integrated on the integration capacitor CF and the integration signal OPOUT (represented as an output voltage $V_{OUT}$) rises with time t as $$V_{OUT} = I_{PD} \cdot t \cdot C_F,$$

wherein $I_{PD}$ is a value of the photocurrent and $C_F$ denotes a capacitance value of the integration capacitor CF.

The integration signal OPOUT, e.g. output voltage VOUT, of the integrator 15 is provided at the comparator input 21. An adjustable reference signal VREF is applied as a comparator reference to the reference input 12. The comparator 20 generates a comparator output signal COUT depending on the values of the output signal VOUT and of the adjustable reference signal VREF. The comparator output signal COUT has a first logical value if the output voltage VOUT is larger than the adjustable reference signal VREF and has a second logical value if the output voltage VOUT is smaller than the adjustable reference signal VREF. The comparator output signal COUT is provided to the latch 22. The comparator 20 and latch 22 are operated as a latched comparator. The latch 22 outputs the comparator output signal COUT only at certain instances which are defined by the clock signal CLK1. Due to the clock signal CLK1 the latched comparator is only comparing the output voltage VOUT of integrator 15 with the adjustable reference signal VREF at certain intervals of the CLK1.

During signal acquisition the logic-and-calculation arrangement 70 counts the pulses of the comparator output signal COUT. Basically, the counting is done by two different counters (not shown). Together the time integrator circuit 10 and a first counter (comprised by the logic-and-calculation arrangement 70) can be considered a first order modulator that generates an asynchronous first count C1. The asynchronous count C1 is directly proportional to the photocurrent Iphoto which is integrated on the integration capacitor CF. Basically, a first count C1 indicates when the integration signal OPOUT, measured as output voltage VOUT, has reached an integration range VDIFF of the time integrator circuit 10. For example, integration range VDIFF is defined as a difference value of the high and low voltage VH, VL, e.g. VH−VL. In this case the comparator output signal is provided to and processed by the logic-and-calculation arrangement 70 as full range output signal LOUT.

The time integrator circuit 10 is reset into the reference condition, when the comparison indicates that the integration signal OPOUT has reached the integration range Vdiff and a first count C1 has been generated. In this case, signal acquisition starts over again. At the same time the counters are reset as well. The control unit 51 not only initializes but also terminates signal acquisition after the integration time AINT has run through. The integration time is set at the control unit 51 depending on the integration time signal STINT, for example.

A second counter (comprised by the logic-and-calculation arrangement 70) generates a second count C2. A second count C2 indicates when the integration signal OPOUT, measured as output voltage VOUT, has reached the adjustable reference signal VREF. While the integration range VDIFF is kept constant during signal acquisition the adjustable reference signal VREF is incremented in defined discrete steps as the integration proceeds. In fact, after a second count C2 has been generated the adjustable reference signal VREF is incremented by one step and a next second count C2 then indicates that the incremented adjustable reference signal has been reached. This will be discussed in further detail with respect to FIG. 2.

The logic-and-calculation arrangement 70 receives both the first and second counts C1, C2 at its input side. The generated first counts C1 are collected as first count signal CT_LOUT and the generated second counts are collected as second count signal CT_COUT. From these signals a digital output signal ADC_OUT is generated and provided at an output of the logic-and-calculation arrangement 70.

Figure 2:
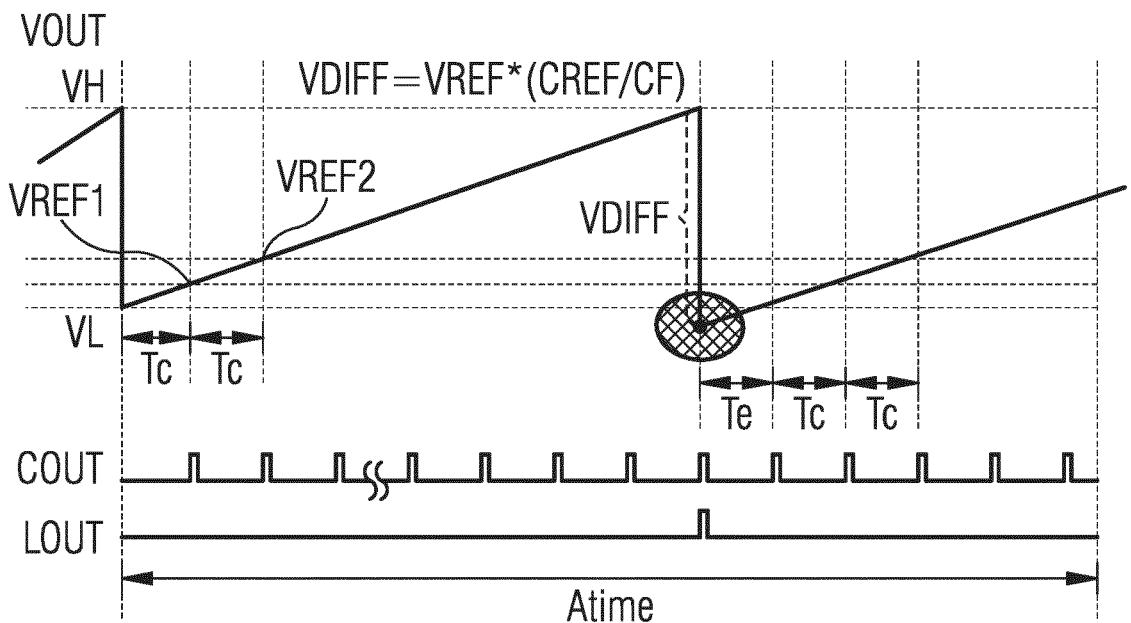
FIG. 2 shows a timing diagram of signals of a light-to-digital converter arrangement.

FIG. 2 shows an exemplary timing diagram of signals of the embodiment of the light-to-frequency converter arrangement shown in FIG. 1. The drawing shows the different signals and operation of the light-to-frequency converter arrangement. The drawing shows the integration signal OPOUT, represented by the output voltage VOUT of the integrator 15. The drawing also shows the comparator output signal COUT and the full range output signal LOUT. The signals are represented as functions of time t. As signal acquisition proceeds for a certain integration time Atime the integration time is shown as a means of reference. Not shown is the clock signal CLK1. The clock signal can be are implemented as a rectangular function having a frequency of 737 kHz. This value should be considered as an example only and is not restricted to these exact values.

The basic operation principle can be described by the concept of a charge-balancing converter. The photodiode collects light which is converted into the photocurrent Iphoto and in several steps converted into counts. The time integrator circuit 10 can be designed as a charge-balancing converter and is used to convert the photocurrent Iphoto to a digital count in the form of the digital output signal ADC_COUNT. The photocurrent Iphoto is integrated into the integration node NEG and the integration capacitor CF generates an input voltage VNEG at the node. If the charge integrated into the integration capacitor CF is larger than a unit charge packet QREF the charge on the integration capacitor CF will be decreased by one unit charge packet and the first counter will be incremented by one logical value. The integration time signal STINT determines an integration time Atime. By integrating the photocurrent Iphoto during the integration time Atime, the first count C1 will result in a measure of intensity of light incident on the photodiode. The integration time Atime may be 100 ms for example.

The digital output signal ADC_OUT is a representation of the photocurrent generated by the photodiode. Its value is derived from the first count signal CT_LOUT and the second count signal CT_COUT. In other words integration of the integration signal is measured by means of first and second counts C1, C2. The first count indicates that the integration signal OPOUT has reached a value which is defined by the integration range VDIFF of the time integrator circuit 10, e.g. VDIFF=VH−VL, i.e. the first count C1 occurs within fixed boundaries defined by the integration range VDIFF of the time integrator circuit 10. Only then the circuit is reset into the reset condition, e.g. to start a new cycle of signal integration. Correspondingly, a first count C1 is generated and collected as first count signal CT_LOUT.

While the first count C1 indicates that the adjustable reference signal VREF has reached the limit of the integration range VDIFF, e.g. given by the high voltage VH, the adjustable reference signal VREF does not hold a constant value as the integration proceeds. Rather, the adjustable reference signal VREF is incremented in discrete steps within the boundary of the integration range VDIFF. For example, the discrete steps of the integration range VDIFF are defined by a difference value of the low and high voltages VL, VH divided by $2^n$, wherein n denotes an integer number. The adjustable reference signal VREF is incremented every time when a second count C2 is generated, i.e. the integration signal OPOUT applied to the comparator reaches the level of the current adjustable reference signal VREF. This way the adjustable reference signal VREF is ramping up in steps of a step-function. Steps of the step-function correspond to the discrete steps mentioned above and can be considered a bin size. As a consequence the adjustable reference signal VREF is divided into $2^n$ bins, e.g. VREF1, VREF2, ..., VREF2n. The integer number n determines the bin size and can be adjusted at that digital-to-analog converter 71. The second count C2 indicates that the integration signal OPOUT has reached one of intermediate values VREF1, VREF2, ..., VREF2n of the adjustable reference signal VREF. However, when a second count C2 is generated, e.g. for a first intermediate value VREF1, the circuit is not reset into the reference condition and signal integration proceeds by incrementing the adjustable reference signal VREF to next bin, e.g. a second intermediate value VREF2. Correspondingly, the generated second counts C2 are collected as second count signal CT_LOUT.

Given the circuit layout presented in FIG. 1 above the integration range VDIFF is defined by the adjustable reference signal VREF, the reference capacitor CREF and the integration capacitor CF. As can be seen in the drawing the integration range limited by the high and low voltages VH, VL can be expressed as:

$$V_{DIFF} = V_{REF,IN} \cdot \frac{C_{REF}}{C_F},$$

wherein $C_{REF}$ is the capacitance value of the reference capacitor CREF, $C_F$ is a capacitance value of the integration capacitor CF and $V_{REF,IN}$ is the voltage value of the reset reference voltage VREFIN. The integration range VDIFF may be subject to variations due to process and temperature changes and may introduce a systematic error in the measurement. A way to account for this error is discussed in further detail in FIGS. 3 and 4.

As a summary from the discussion above an example measurement cycle may involve the following steps. Initially, when the input control signal ADC_ON is low, the time converter circuit 10 is reset. Resetting the converter may involve clearing the photodiode; clearing the integration capacitor CF; resetting an input voltage VNEG at node NEG reset reference voltage VREFIN; resetting the output voltage VOUT to a value lower than the adjustable reference signal (or voltage) VREF. As a consequence the comparator output signal COUT, LOUT is low. The reference capacitor CF is fully charged with the charge package QREF and disconnected from the integration node NEG. The first and second counters are cleared so that the digital output signal ADC_OUT is 0. A switch signal applied to the second switch 32 is low.

After the reset into the reference condition, signal acquisition can be initialized by setting the input control signal ADC_ON from low to high. The integration time signal STINT transits from low to high at the same time and the light-to-digital converter starts operation. The photocurrent Iphoto generated by the photodiode is integrated by the integrator 15 comprising the amplifier 16 and the integration capacitor CF. The photocurrent Iphoto is integrated at the integration node NEG and the output voltage VOUT representing the integration signal OPOUT is ramping up during integration. The comparator 20 monitors the output voltage VOUT of the integrator 15 that is the output voltage VOUT of the amplifier 16.

When the output voltage VOUT is larger than the adjustable reference signal VREF, i.e. has reached one of intermediate values VREF1, VREF2, ..., VREF2n of the adjustable reference signal VREF, the comparator output signal COUT is high and a corresponding second count is generated and collected as second count signal CT_COUT. Furthermore, the logic-and-calculation arrangement 50 issues a control signal to the digital-to-analog converter 71 to proceed to a next intermediate value VREF1, VREF2, ..., VREF2n of the adjustable reference signal VREF. When the output voltage VOUT has reached the upper threshold of the integration range, e.g. high voltage VH, the comparator output signal LOUT is high and a charge packet $Qref=V_{ref,in} \cdot C_{ref}$ is dumped into the integration node NEG. The output signal LOUT is received at the logic-and-calculation arrangement 5, e.g. the first counter, and a first count C1 is generated and collected as first count signal CT_LOUT.

After the charge dumping the time integrator circuit 10 is reset into the reference condition. For example, the output voltage VOUT is reduced by a pre-defined voltage value. This value can be defined or be equal to the integration range, e.g. $V_{ref,in} \cdot C_{ref}/C_{int}$. However, in order to account for variation of the integration range with process or temperature variations, the value of reference condition could be set such that the output voltage VOUT returns to a level lower than the low voltage VL, for example. This is indicated by an circle in the drawing.

As the output voltage VOUT returns back to low, e.g. the level of the reset reference voltage VREFIN, it may ramp up back again in a next integration cycle. A number N of dumpings is increased by one count. The output voltage VOUT swings between the high and low voltages VL, VH. This process is characterized by a charge dumping period and will repeat itself until the integration time Atime is over, i.e. the signal STINT transits from high to low. During the integration time Atime, the signal STINT is high, the number first and second counts are accumulated by the counters. The first count value C1 is equal to the number N of dumpings and provides a first measure of the intensity of the incident light. The first count C1 is equal to the number N of dumpings counted by the first counter. The number N of charge dumpings is equal to the counts of the first counter generated over the period defined by the integration time Atime.

The succession of second counts C2 over time can be characterized by partial integration times which may be defined with respect to the clock signal CLK1. An initial partial integration time Te is defined as a time stamp at which the first of second counts C2 is generated, e.g. after initially starting to integrate charge from the sensor device or after a new signal acquisition cycle when the time integrator circuit 10 has been reset into the reference condition. Further partial integration times, denoted intermediate partial integration times Tc hereinafter, are defined as respective time stamps at which the further of second counts C2 is generated after the initial partial integration time and before resetting the time integrator circuit into the reference condition.

In an ideal condition the partial integration times Te, Tc all have the same value. However, a start of signal acquisition may not begin from a known value even if the time integrator circuit has been rest into the reference condition. Thus, the initial partial integration time Te may be different from the intermediate partial integration times Tc. For example, a source for such error may be due to incorrect initialization of the time converter circuit during reset. This may be due to variation of the integration range with process in temperature as indicated by the circle in the drawing. As a consequence, the integration of the first cycle may not always start from a known value. This uncertainty may introduce a measurement error in the first and second counts C1, C2.

The digital output signal ADC_OUT can be determined by the following equation:

$$ADC - OUT = (2^n - 1) \cdot CT_{LOUT} + CT_{COUT} + \frac{\sum Te(CT_{LOUT})}{Tc},$$

wherein ADC-OUT, $CT_{LOUT}$, $CT_{COUT}$, Te, and Tc denote the digital output signal, the first count signal, the second count signal, the initial partial integration time and the intermediate partial integration time, respectively. The latter term can be used to account for sources of error where the initial partial integration time Te turns out to be different from the intermediate partial integration times Tc. The logic-and-calculation arrangement can use the clock signal CLK1 in order to determine the time stamps associated with the occurrences of first and second counts C1, C2 and derive the initial partial integration time Te and the intermediate partial integration times Tc from there.

Figure 3:
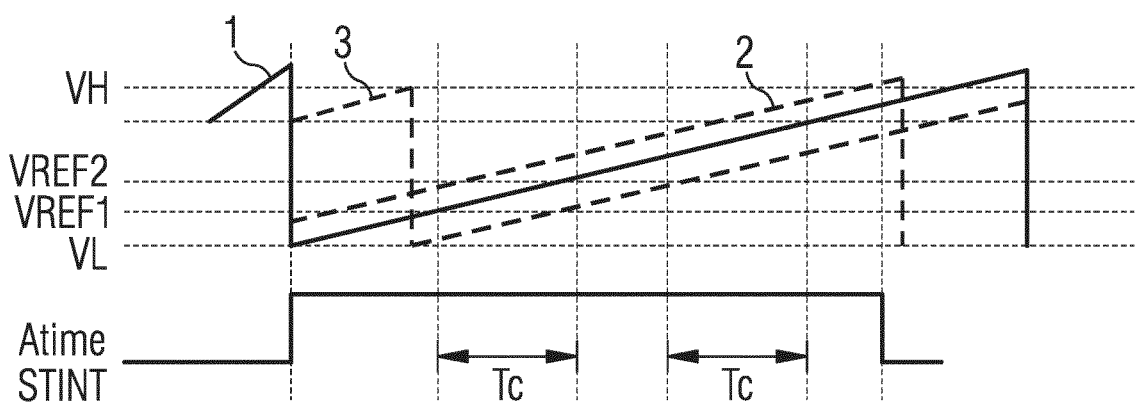
FIG. 3 shows another timing diagram of signals of a light-to-digital converter arrangement.

FIG. 3 shows another timing diagram of signals of a light-to-digital converter arrangement. This drawing shows three different graphs of integration signals 1, 2, 3. The drawing also shows the integration time signal STINT as a function of time which determines the integration time Atime.

The first integration signal 1 is shown as a solid line and has been ramped up to the high-voltage VH and returned to the low-voltage VL. When the circuit is reset into the reference condition the solid line returns to the level of the low-voltage VL. The integration time signal STINT is set high in order to start a measurement cycle according to the integration time Atime. After the initial partial integration time Te the integration signal OPOUT reaches the first intermediate reference level VREF1 of the adjustable reference signal VREF. A first of second counts C2 is generated. Then, the integration signal OPOUT continues to ramp up and eventually reaches a second intermediate reference level VREF2 of the adjustable reference signal VREF. This continues until the integration time Atime has lapsed. When starting integration from the low-voltage VL and when the integration time signal STINT is set high, the initial partial integration time Te and the intermediate partial integration time Tc essentially are the same in value.

The second integration signal 2 is shown as a dashed line in the drawing. As can be seen the light-to-digital converter arrangement has not been reset to the low-voltage VL. At the beginning of the integration time Atime, as indicated with the transition of the integration time signal STINT from low to high, a certain voltage level is present. As a consequence the integration signal OPOUT reaches the first intermediate reference level VREF1 at an earlier instant in time when compared to the first integration signal 1. Thus, the initial partial integration time Te is smaller than the intermediate partial integration time Tc. In turn, the initial partial integration time Te can be used to determine the starting voltage level.

The third integration signal 3 is also shown as a dashed line in the drawing. Again, the light-to-digital converter arrangement has not been reset to the low-voltage VL. In this case, however, at the beginning of the integration time Atime the integration signal OPOUT already starts at a rather high level and reaches the high-voltage VH within the time of the initial partial integration time Te, for example. Then, the light-to-digital converter is reset into the reference condition and starts a new integration cycle within the duration of the integration time Atime. At the end of the integration time Atime, however, the third integration signal 3 has not yet reached the high-voltage VH again. In other words, the integration cycle again does not entirely use the integration range VDIFF but a smaller range.

As for the third integration signal 3 the integration range defined by VDIFF=VH−VL is not fully exploited. The bin size or discrete steps by which the adjustable reference VREF is incremented by means of the digital-to-analog converter 71 is defined by $VDIFF/2^n$ as discussed above. In order to have the same number of 2n steps or bins of the adjustable reference VREF the integration range VDIFF can be exchanged with the actual range that is exploited during signal acquisition. This range can be derived using an adaptive binning algorithm. Basically, at or after resetting the light-to-digital converter into its reference condition the signal or output voltage provided by the integrator 15 is measured in order to set an initial value. From this initial value the actual range that is exploited during signal acquisition can be used and divided into 2n bins or discrete steps. Thus, the bin size can be adjusted to the actual range used by the light-to-digital converter.

Figure 4:
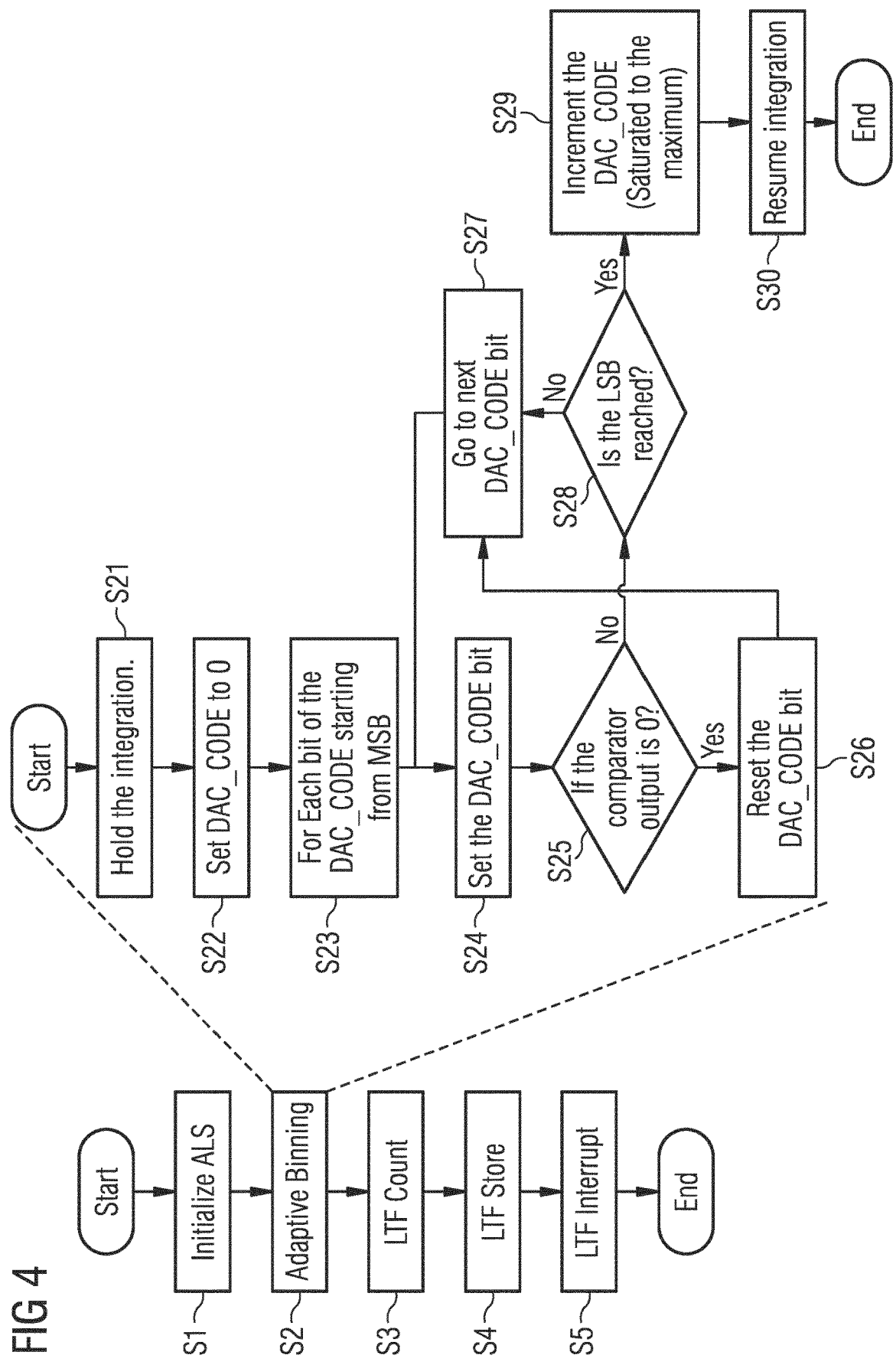
FIG. 4 shows an embodiment of an adaptive binning algorithm.

FIG. 4 shows an embodiment of an adaptive binning algorithm. The left side of the drawing shows a flow chart which summarizes an embodiment of the method for light-to-digital conversion during an integration cycle. Every integration cycle is started by initializing the time converter circuit 10. As discussed above this involves setting or resetting the time converter circuit 10 into the reference condition (step S1). In a next step the method enters an adaptive binning procedure (see step S2). An adaptive binning algorithm is applied to determine an initial value of the integration signal. The integration signal may differ from an ideal condition due to external influences and process variations.

In a next step S3 the integration of charge is initiated and an integration signal is being generated. Step S3 further includes generation of first and second counts C1, C2 as well as incrementing the adjustable reference signal as integration proceeds within the limits defined by the integration range Vdiff. In step S4 the first and second counts C1, C2 are collected and stored as first count signal CT_LOUT and CT_COUT, respectively. Finally, in step S5 the integration cycle is interrupted. The interrupt is issued when the integration cycle is completed, i.e. when a first count C1 has been generated or the integration signal OPOUT has reached the integration range Vdiff. Then the method may return to step S1 and a next integration cycle may start. The interrupt, however, is also issued when the overall integration time Atime has lapsed. Then the current integration cycle may not be complete and no eventually no additional first count C1 is generated.

The right side of the drawing shows a flow chart which summarizes an embodiment of an adaptive-binning algorithm. The adaptive binning procedure is entered in step S2. First, integration of charge is held without further integrating charge (step S21). This way the initial value of the integration signal can be determined. The next steps make use of the logic-and-calculation arrangement 50 and adjustable reference circuit 70. One way to determine the initial value of the integration signal involves the n-bit digital-to-analog converter 71.

In step S22 a DAC code is set to a starting condition, e.g. set to zero. For example, the n-bit digital-to-analog converter 71 is arranged to output a binary number or container of n-bit. The container for n-bit binary numbers has a least significant bit LSB assigned the bit number 0 and a most significant bit MSB assigned the bit number n, with intermediate least significant bits LSB-n in-between. The DAC code at the starting condition may be set to zero for all n-bits of the container. Step S23 initializes the procedure to the initial value of the integration signal starting with the most significant bit MSB and proceed to lower significant bits later on.

In step S24 a bit of the DAC code is set. If the output of comparator 20 (or latch 22) in step S25 is zero the method proceeds to step S26 and resets the current bit of the DAC code and jumps to the next DAC code bit in step S27. If the output of comparator 20 (or latch 22) in step S25 is not zero the method proceeds to step S28. In step S28 it is determined whether the least significant bit LSB is reached. If not, the method proceeds with step S27. If the least significant bit LSB has been reached the DAC code is incremented and eventually saturated to its maximum (step S29). Then integration is resumed in step S30 and the adaptive binning ends for the current integration cycle. The adaptive binning may start over again in a next integration cycle.

The resulting DAC code constitutes a bit number which is a representation of the initial value of the integration signal OPOUT after starting signal integration. The integration of charge in step S3 is initiated from that initial value and proceeds for the duration of the initial partial integration time Te. After this time the integration signal has reached the adjustable reference signal Vref. Typically, the first value of the adjustable reference signal Vref equals the low voltage VL. However, in other circumstances the first value of the adjustable reference signal Vref equals an intermediate adjustable reference signal VREF1, for example. In either case initial partial integration time Te can be determined and further integration proceeds from a known reference value, e.g. by incrementing the adjustable reference signal Vref as integration proceeds within the limits defined by the integration range Vdiff.

The adaptive-binning algorithm can be used to detect the value of the integration signal OPOUT after starting signal integration. It can be shown that the algorithm may minimize the error within 1-LSB. Adaptive-binning algorithm allows us to identify the start point of integration immediately. This ensures more optimized time for conversion, which may be quite high for low-photocurrents. Furthermore, as the value of the integration range VDIFF value can have variation due to process and temperature drift effects, there is a possibility for subtraction voltage to be slightly higher or lower than the integration range VDIFF. This error can be accounted for by measuring the partial integration times Te and Tc to correct this fractional error.

In conclusion, existing light-to-digital converter architectures may be limited in a maximum gain they are able to achieve. A typical value is in the range of 512×. Given an integration range of ~11 mV and capacitor values of CF=244fF and CREF=43fF the proposed architecture allows for scaling the gain to 2000 or 3000 or higher. This can be achieved without using smaller capacitors and smaller integration range which would induce higher noise. These properties are supported by keeping the integration range VDIFF, e.g. integration voltage VH−VL, constant for all gain settings. For these conditions, the capacitor values of the reference capacitor CREF and integration capacitor CF may be higher, therefore having lower system noise. Furthermore, an impact of latch-synchronisation error may be lower since VDIFF is subtracted lower for higher counts C1 and gain. The impact of latch-synchronisation error is much lower since the integration range VDIFF subtraction and comparator output-latch event may occur much lower (depending on the chosen values of VREF and CF).

Further aspects of the proposed concept can be summarized as follows:

the integrating range VDIFF, e.g. represented as integration voltage VH−VL, can be fixed for every gain setting, the integrating range VDIFF can be sub-divided into $2^n$ levels using the adjustable reference signal VREF, e.g. provided by digital-to-analog converter 71, the overall gain of the light-to-digital converter arrangement may be dependent on $$\frac{V_H - V_L}{2^n},$$

each second count C2 does not subtract the integration range VDIFF from the integration voltage, e.g. on integration signal OPOUT. The value of the integration range VDIFF, e.g. integration voltage VH−VL, is subtracted only once in $2^n$ second counts C2 or when a first count C1 has been generated.

In an example configuration the light-to-digital converter uses an 8-bit digital-to-analog converter, DAC. The effective system gain can be as high as Again=4096. If the second count signal CT_COUT is incremented for every change in the DAC code, i.e. for every second count C2 being generated, the effective system is at maximum gain, e.g. Again. If, for example, the second count signal CT_COUT is incremented for every alternate second count C2 being generated, or DAC code change, then the effective system gain may be half the maximum gain and so on. Further, the effective gain Again can be reduced by choosing a frequency of changing the DAC code without changing the reset reference voltage VREFIN or the reference capacitor CREF.

We claim:

1. A method for light-to-digital conversion comprising:
setting a time integrator circuit into a reference condition,
starting to integrate charge from a sensor device for the duration of an integration time,
generating an integration signal indicative of the integrated charge,
comparing the integration signal with an adjustable reference signal,
generating a first count when the comparison indicates that the integration signal has reached an integration range, wherein the integration range is defined by a low and a high voltage,
generating a second count when the comparison indicates that the integration signal has reached the adjustable reference signal,
incrementing the adjustable reference signal in discrete steps when a second count has been generated,
resetting the time integrator circuit into the reference condition, when the comparison indicates that the integration signal has reached the integration range,
collecting the generated first counts as first count signal and the generated second counts as second count signal, and
generating a digital output signal depending on the first count signal and the second count signal, wherein
the integration time is subdivided into partial integration times using a clock signal,
an initial partial integration time is defined as a time stamp at which the first of second counts is generated after starting to integrate charge from a photo sensor device or resetting the time integrator circuit into the reference condition, and
an intermediate partial integration time is defined as a time stamp at which a further of second counts is generated after the initial partial integration time and before resetting the time integrator circuit into the reference condition, and wherein the digital output signal is determined by the following equation:

$$ADC-OUT = (2^n - 1) \cdot CT_{LOUT} + CT_{COUT} + \frac{\sum Te(CT_{LOUT})}{Tc},$$

wherein ADC−OUT, $CT_{LOUT}$, $CT_{COUT}$, Te, and Tc denote the digital output signal, the first count signal, the second count signal, the initial partial integration time and the intermediate partial integration time, respectively.

2. The method according to claim 1, wherein the adjustable reference signal is incremented in discrete steps of the integration range.

3. The method according to claim 2, wherein the discrete steps of the integration range are defined by a difference value of the low and high voltages divided by $2^n$, wherein n denotes an integer number.

4. The method according to claim 1, wherein the time integrator circuit is only reset back into the reference condition when a first count has been generated.

5. The method according to claim 1, wherein the integration range (Vdiff) is kept constant during the integration time (Atime).

6. The method according to claim 1, wherein
at starting to integrate charge from the sensor device and resetting the time integrator circuit into the reference condition an initial value of the integration signal is determined, and/or
adjust a step size of adjustable reference signal using an adaptive binning algorithm and depending on the determined initial value of the integration signal.

7. A light-to-digital converter arrangement, comprising:
a time integrator circuit comprising a sensor input for connecting a sensor device, a reference input for connecting an adjustable reference signal, and a result output for providing an integration signal, wherein the time integrator circuit is arranged for integrating charge from the sensor device for the duration of an integration time,
a reset circuit connected to the sensor input and arranged to start and/or reset the time integrator circuit into a reference condition,
a logic-and-calculation arrangement connected to the result output and to the reset circuit and arranged for
comparing the integration signal with an adjustable reference signal,
generating a first count when the comparison indicates that the integration signal has reached an integration range, wherein the integration range is defined by a low and a high voltage,
generating a second count when the comparison indicates that the integration signal has reached the adjustable reference signal, and
generating a digital output signal depending on first and second counts collected as first count signal and second count signal, respectively, and
an adjustable reference circuit connected to the logic-and-calculation arrangement and arranged to increment the adjustable reference signal in discrete steps when a second count has been generated, wherein
the integration time is subdivided into partial integration times using a clock signal,
an initial partial integration time is defined as a time stamp at which the first of second counts is generated after starting to integrate charge from a photo sensor device or resetting the time integrator circuit into the reference condition, and
an intermediate partial integration time is defined as a time stamp at which a further of second counts is generated after the initial partial integration time and before resetting the time integrator circuit into the reference condition, and wherein the digital output signal is determined by the following equation:

$$ADC-OUT = (2^n - 1) \cdot CT_{LOUT} + CT_{COUT} + \frac{\sum Te(CT_{LOUT})}{Tc},$$

wherein ADC−OUT, $CT_{LOUT}$, $CT_{COUT}$, Te, and Tc denote the digital output signal, the first count signal, the second count signal, the initial partial integration time and the intermediate partial integration time, respectively.

8. The light-to-digital converter arrangement according to claim 7, wherein the logic-and-calculation arrangement comprises a control logic connected to the reset circuit and arranged for resetting the time integrator circuit into the reference condition.

9. The light-to-digital converter arrangement according to claim 7, wherein the time integrator circuit comprises
- an integrator with a integration capacitor, an amplifier having a first amplifier input, a second amplifier input and an amplifier output, the amplifier configured to integrate the charge from the sensor device on the first amplifier input, receive a first reference voltage on the second amplifier input, and provide the integration signal on the amplifier output, and
- a comparator having a first comparator input, the reference input as a second comparator input and a comparator output, the comparator configured to receive the integration signal on the first comparator input, receive the adjustable reference signal on the reference input, and provide a compare output signal on the comparator output.

10. The light-to-digital converter arrangement according to claim 9, wherein the logic-and-calculation arrangement comprises a latch which is connected to the comparator output of the comparator to form a latched comparator, arranged to provide the first and second counts depending on the compare output signal and a clock signal ) provided by the control unit.

11. The light-to-digital converter arrangement according to claim 7, wherein the adjustable reference circuit comprises a n-bit digital-to-analog converter which on its output side is connected to the reference input and arranged to generate the adjustable reference signal.

12. The light-to-digital converter arrangement according to claim 8, wherein the n-bit digital-to-analog converter is arranged to increment the reference signal in discrete steps of the integration range, wherein the discrete steps of the integration range are defined by a difference value of the low and high voltages divided by $2^n$, wherein n denotes an integer number.

13. The light-to-digital converter arrangement according to claim 8, wherein the logic-and-calculation arrangement comprises
- a logic unit which is arranged to provide a control signal to the control unit to initiate resetting the time integrator circuit into the reference condition by means of the control unit, and/or arranged to determine an initial value of the integration signal at starting to integrate charge from the sensor device and resetting the time integrator circuit into the reference condition, and/or
- a calculation unit which is arranged to adjust a step size of the adjustable reference signal using an adaptive binning algorithm and depending on the determined initial value of the integration signal.

14. The method according to claim 6, wherein:
at starting to integrate charge from the sensor device and resetting the time integrator circuit into the reference condition an initial value of the integration signal is determined, and/or
adjust a step size of adjustable reference signal using an adaptive binning algorithm and depending on the determined initial value of the integration signal, and wherein the adaptive binning algorithm comprises:
entering an adaptive binning procedure,
integrating a charge that is held without further integrating charge to determine the initial value of the integration signal,
setting a DAC code to a starting condition, wherein the container for n-bit binary numbers has a least significant bit LSB assigned the bit number 0 and a most significant bit MSB assigned the bit number n, with intermediate least significant bits LSB-n in-between,
initializing the procedure to the initial value of the integration signal starting with the most significant bit MSB and proceed to lower significant bits later on,
setting a bit of the DAC code,
if a comparison of the adjustable reference signal and the integration signal is zero the method proceeds to reset the current bit of the DAC code and jump to the next DAC code bit,
if the comparison of the adjustable reference signal and the integration signal is not zero, determine whether the least significant bit LSB is reached, go to next bit of DAC code,
if the least significant bit LSB has been reached the DAC code is incremented and eventually saturated to its maximum, then integration is resumed and the adaptive binning ends for the current integration cycle.

15. The method according to claim 14, wherein the starting condition comprises setting the DAC code to zero, using a n-bit digital-to analog converter to output a binary number or container of n-bit.

* * * * *